(12) United States Patent
Cai et al.

(10) Patent No.: US 8,536,639 B2
(45) Date of Patent: Sep. 17, 2013

(54) I-SHAPE FLOATING GATE FOR FLASH MEMORY DEVICE AND FABRICATING THE SAME

(75) Inventors: Yimao Cai, Beijing (CN); Song Mei, Beijing (CN); Ru Huang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 13/498,585

(22) PCT Filed: Nov. 30, 2011

(86) PCT No.: PCT/CN2011/083258
§ 371 (c)(1),
(2), (4) Date: Mar. 28, 2012

(87) PCT Pub. No.: WO2013/056491
PCT Pub. Date: Apr. 25, 2013

(65) Prior Publication Data
US 2013/0099300 A1  Apr. 25, 2013

(30) Foreign Application Priority Data
Oct. 20, 2011  (CN) .......................... 2011 1 0320029

(51) Int. Cl.
*H01L 29/788* (2006.01)
*H01L 21/336* (2006.01)
*H01L 21/3205* (2006.01)
*H01L 21/4763* (2006.01)

(52) U.S. Cl.
USPC ............... 257/315; 257/316; 257/E29.129; 257/E29.3; 257/E21.422; 257/E21.681; 438/257; 438/593; 438/594

(58) Field of Classification Search
None
See application file for complete search history.

(56) References Cited

U.S. PATENT DOCUMENTS 5,763,913 A * 6/1998 Jeong ............................ 257/316
5,886,379 A * 3/1999 Jeong ............................ 257/319
5,981,335 A * 11/1999 Chi .............................. 438/253

(Continued)

FOREIGN PATENT DOCUMENTS

| CN | 101436568 | 5/2009 |
| JP | 10098119 A * | 4/1998 |
| KR | 1020080061151 | 7/2008 |
| KR | 1020080067442 | 7/2008 |

OTHER PUBLICATIONS

International Search Report issued in PCT/CN2011/083258 on Aug. 9, 2012.

(Continued)

*Primary Examiner* — Hoang-Quan Ho
(74) *Attorney, Agent, or Firm* — DLA Piper LLP US

(57) ABSTRACT

The present invention discloses a floating gate structure of a flash memory device and a method for fabricating the same, which relates to a nonvolatile memory in a manufacturing technology of an ultra-large-scaled integrated circuit. In the invention, by modifying a manufacturing of a floating gate in the a standard process for the flash memory, that is, by adding three steps of deposition, two steps of etching and one step of CMP, an エ-shaped floating gate is formed. In addition to these steps, all the other steps are the same as those of the standard process for the flash memory process. By the invention, a coupling ratio may be improved effectively and a crosstalk between adjacent devices may be lowered, without adding additional photomasks and barely increasing a process complexity, which are very important to improve programming speed and reliability.

3 Claims, 4 Drawing Sheets

(56) References Cited

U.S. PATENT DOCUMENTS

| | | | | |
|---|---|---|---|---|
| 6,093,604 | A * | 7/2000 | Jeong | 438/257 |
| 6,297,097 | B1 * | 10/2001 | Jeong | 438/264 |
| 6,423,584 | B2 * | 7/2002 | Takahashi et al. | 438/152 |
| 6,762,093 | B2 * | 7/2004 | Rudeck | 438/257 |
| 6,774,431 | B2 * | 8/2004 | Rudeck | 257/316 |
| 6,908,817 | B2 * | 6/2005 | Yuan | 438/264 |
| 6,914,289 | B2 * | 7/2005 | Bross | 257/316 |
| 6,916,707 | B2 * | 7/2005 | Rudeck | 438/257 |
| 7,566,616 | B2 | 7/2009 | Song | |
| 7,588,982 | B2 * | 9/2009 | Sandhu et al. | 438/257 |
| 7,709,322 | B2 | 5/2010 | Song | |
| 7,960,778 | B2 * | 6/2011 | Lee | 257/316 |
| 2005/0023599 | A1 | 2/2005 | Song | |
| 2008/0308858 | A1 * | 12/2008 | Sandhu et al. | 257/316 |
| 2009/0130835 | A1 | 5/2009 | Lai et al. | |
| 2009/0233432 | A1 | 9/2009 | Song | |
| 2012/0187467 | A1 * | 7/2012 | Rogers et al. | 257/315 |

OTHER PUBLICATIONS

English Language Abstract of CN 101436568 published May 20, 2009.

English Lanugage Abstract of KR 20080061151 published Jul. 25, 2008.

English Language Abstract of KR 20080067442 published Jul. 21, 2008.

* cited by examiner

I-SHAPE FLOATING GATE FOR FLASH MEMORY DEVICE AND FABRICATING THE SAME

CROSS-REFERENCE OF RELATED APPLICATIONS

This application is a U.S. National Stage Application of International Application No. PCT/CN2012/074965 filed May 5, 2012, which claims priority from Chinese Patent Application No. 201110320029.4 filed on Oct. 20, 2011. The entirety of all the above-listed applications are which is incorporated herein by reference in it's entirety.

FIELD OF THE INVENTION

The present invention relates to a nonvolatile memory of a manufacturing technology of an ultra-large-scaled integrated circuit, and in particular, to a floating gate structure of a flash memory, which is capable of increasing a coupling ratio of the flash memory, reducing a crosstalk between adjacent cells, lowering an operating voltage and improving reliability, and a method for fabricating the same.

BACKGROUND OF THE INVENTION

Nowadays a flash memory is a mainstream technology of a nonvolatile memory. The flash memory has advantages of being able to keep data in a case of power-off, having a good compatibility with a CMOS process and capable of erasing and writing data for multiple times, etc., and thus it is widely used in various products, for example, a storage and communication device such as a mobile phone, a laptop, a palmtop and a solid state driver. The flash memory usually employs a polysilicon floating gate to store data (charges). The flash memory cell and its floating gate structure are usually as shown in FIG. 1, where a voltage on a control gate controls a channel of the flash memory cell via the floating gate by a certain coupling ratio. The larger the coupling ratio is, the stronger the control capability of the control gate to the channel will be. Therefore, by improving the coupling ratio of the flash memory device, an operating voltage of the flash memory for programming and erasing may be reduced, and an influence on the reliability caused by a fluctuation of the number of charges stored on the floating gate may also be reduced. The coupling ratio Cr may be calculated via a formula $$Cr = \frac{Cono}{Ctotal},$$

where Ctotal is a summation of capacitances between the floating gate and all of the other electrodes, and Cono is a capacitance between the floating gate and the control gate, thus the coupling ratio may be effectively increased by increasing Cono. However, with a rapid diminishing of a size of the flash memory device, a space between adjacent cells is reduced drastically. In order to reduce a crosstalk between adjacent cells, a thickness of the floating gate should also be correspondingly reduced greatly, which causes an area of a dielectric layer between the floating gate and the control gate to be reduced drastically, thereby the capacitance value Cono is also reduced greatly. Thus, the coupling ratio is diminished with the diminishing of the size of the flash memory device, which may cause problems that it is difficult to lower an operating voltage and an anti-interference ability is poor. It is an effective method to improve the coupling ratio of the flash memory cell by employing a dielectric material having a high dielectric constant and increasing the contact area between the floating gate and the control gate in structure design.

SUMMARY OF THE INVENTION

An object of an embodiment of present invention is to provide a エ-shape floating gate structure of a flash memory device, and a method for fabricating the same.

A technical solution according to an embodiment of the invention is as followings.

According to the embodiment of the invention, a cross section of the floating gate structure of the flash memory device in the direction of a width of a channel are formed in a エ-shape, that is, the floating gate structure is divided into three parts having an upper part, a middle part and a lower part, wherein the upper part and the lower part are wider, and the middle part is narrower. Thus, under the same device size, an area between the floating gate and a control gate of the flash memory device may be effectively increased, thereby attaining objects of improving a coupling ratio of the flash memory device, lowering an operating voltage and improving a reliability thereof.

A method for fabricating a floating gate structure of the flash memory device according to one embodiment of the invention will now be described briefly, which comprises the steps of:

1-1) Growing a sacrificial silicon oxide layer and depositing a silicon nitride layer on a silicon substrate sequentially;

1-2) Performing a photolithography process and an etching process on an active region to form a shallow trench isolation region;

1-3) Depositing an isolation dielectric layer, removing the sacrificial silicon oxide layer and the silicon nitride layer, so as to open a window for a region of the floating gate structure;

1-4) Growing or depositing a tunneling oxide layer, and then depositing a polysilicon layer for a floating gate and a germanium-silicon layer sequentially;

1-5) Depositing a top polysilicon layer for the floating gate and performing an etching back process to form a polysilicon hard mask;

1-6) Etching the germanium-silicon layer by taking the polysilicon hard mask as a hard mask, and stopping the etching at the bottom polysilicon layer of the floating gate structure;

1-7) Depositing a polysilicon layer such that the top polysilicon layer of the floating gate structure and the bottom polysilicon layer of the floating gate structure are connected with each other;

1-8) Performing a chemical mechanical polishing (CMP) to the top polysilicon layer, and stopping the polishing at the oxide layer of the isolation region;

1-9) Etching back the oxide layer of the shallow trench isolation region to laterally expose the germanium-silicon layer deposited in the step 4;

1-10) Removing the germanium-silicon layer via a wet etching process, and depositing a blocking oxide layer;

1-11) Depositing a control gate polysilicon, so as to forming an エ-shape floating gate structure surrounded by the control gate polysilicon;

1-12) After forming the floating gate structure of the invention, subsequent processes for fabricating the flash memory cell are the same as traditional flash memory processes.

In comparison with the prior art, the embodiment of the invention has the following beneficial effects. By ways of designing the floating gate structure, a contact area between the floating gate and the control gate in the cell is increased and a coupling ratio between adjacent cell is decreased at the same time. Therefor, a gate coupling ratio of the flash memory device can be improved under the same device size, so that an operating voltage of the flash memory device can be lowered, a crosstalk can be reduced and a reliability can be improved. Moreover, when a size of the flash memory device is reduced drastically, the coupling ratio can be maintained and a performance of the flash memory device is guaranteed. Meanwhile, the ⊥-shape floating gate structure provided in the embodiment of the invention may also employ a dielectric material having a high dielectric constant, thereby further increasing the coupling ratio of the flash memory device.

Therefore, in comparison with the prior art, by a technical solution provided according to the embodiment of the invention, the coupling ratio of the flash memory device can be effectively increased under the same size, thereby lowering the operating voltage and improving the reliability thereof. Moreover, the technology may also be compatible with a technology in which a dielectric material having a high dielectric constant is employed.

BRIEF DESCRIPTION OF THE DRAWINGS

FIG. 2 is a schematic diagram of a floating gate structure according to the invention, in which:

reference sign "01" represents a floating gate, reference sign "02" represents a tunneling oxide layer, reference sign "03" represents a substrate, reference sign "04" represents a shallow trench isolation region.

Figure 1:
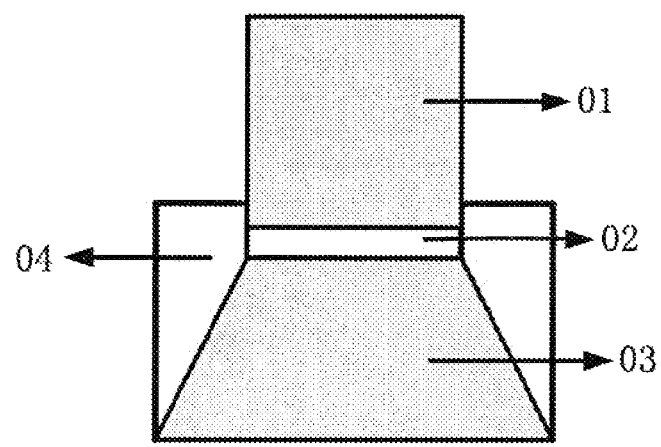
FIG. 1 is a schematic diagram of a general floating gate flash memory cell and a floating gate structure thereof, in which: reference sign "01" represents a floating gate, reference sign "02" represents a tunneling oxide layer, reference sign "03" represents a substrate, reference sign "04" represents a shallow trench isolation region.
Figure 2:
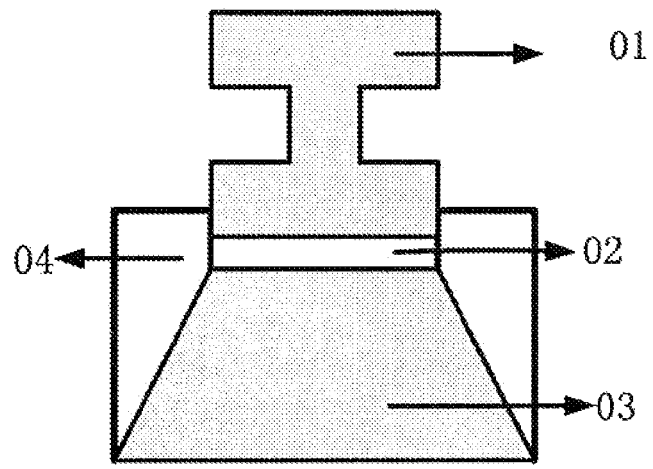
Figure 3A:
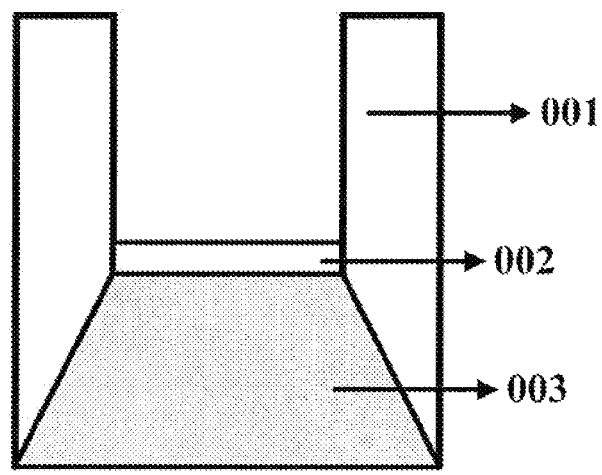
Figure 3B:
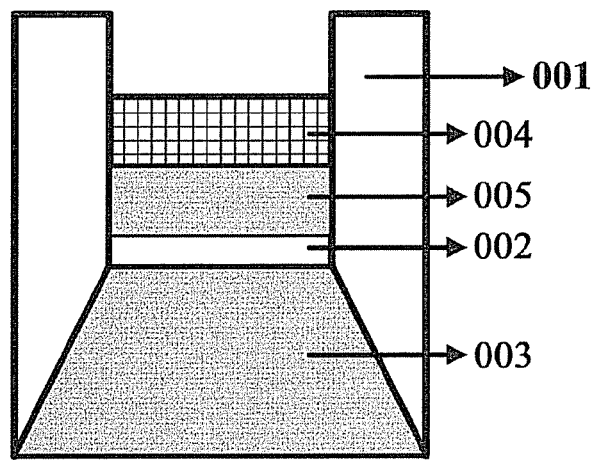
Figure 3C:
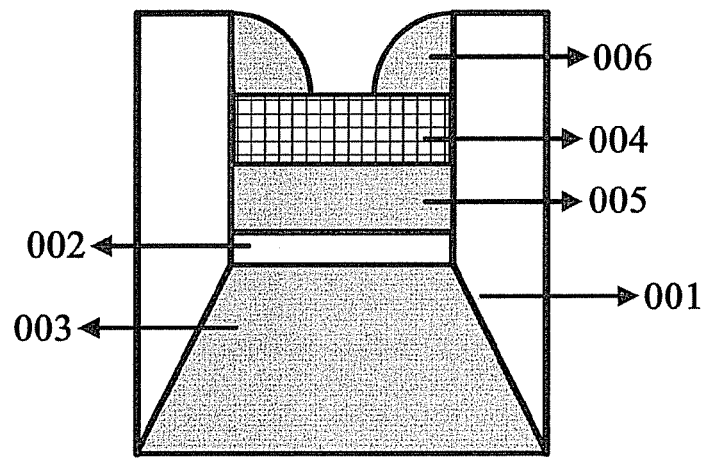
Figure 3D:
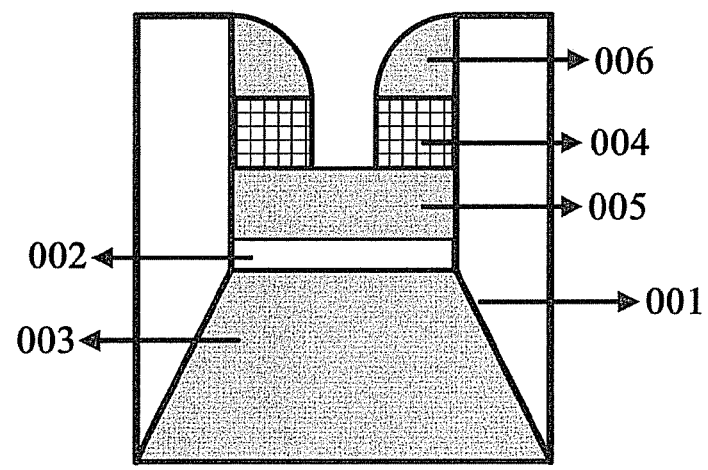
Figure 3E:
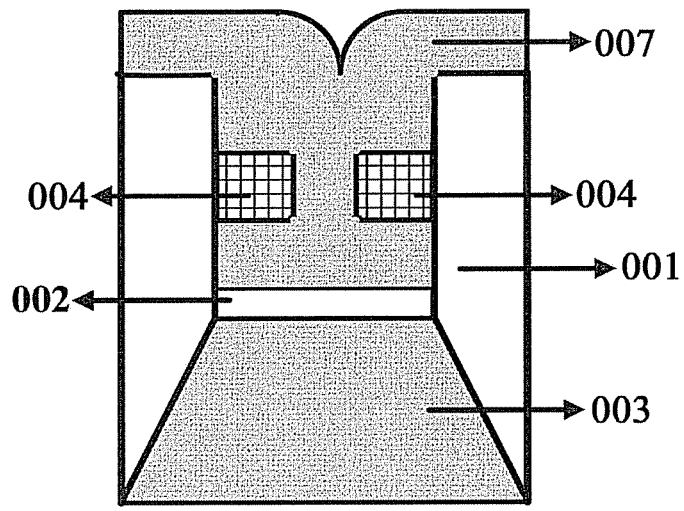
Figure 3F:
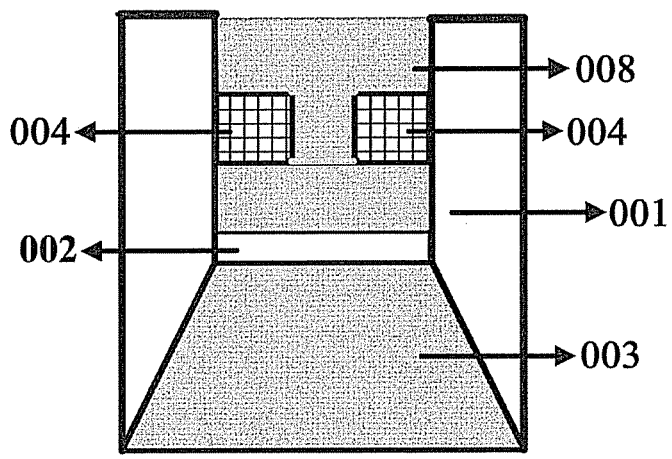

FIG. 3 shows main process steps for fabricating a floating gate structure of the invention, in which:

FIG. 3a shows a window of a region of the floating gate structure and the tunneling oxide layer on a surface of an active region, in which:

reference sign "001" represents an oxide layer in the isolation region, reference sign "002" represents the tunneling oxide layer, reference sign "003" represents the substrate;

FIG. 3b represents a step of depositing a bottom polysilicon layer of a floating gate and a germanium-silicon layer sequentially, in which:

reference sign "001" represents the oxide layer in the isolation region, reference sign "004" represents the germanium-silicon layer, reference sign "005" represents the bottom polysilicon layer, reference sign "002" represents the tunneling oxide layer, reference sign 20. "003" represents the substrate;

FIG. 3c shows a step of depositing a top polysilicon layer and performing an etching back process to form a polysilicon hard mask, in which:

reference sign "006" represents the polysilicon hard mask, reference sign "004" represents the germanium-silicon layer, reference sign "005" represents the bottom polysilicon layer, reference sign "001" represents the oxide layer in the isolation region, reference sign "002" represents the tunneling oxide layer, reference sign "003" represents the substrate;

FIG. 3d shows a step of etching the germanium-silicon material by taking the polysilicon hard mask as a hard mask, and stopping the etching at the bottom polysilicon layer of the floating gate, in which:

reference sign "006" represents the polysilicon hard mask, reference sign "004" represents the germanium-silicon layer, reference sign "005" represents the bottom polysilicon layer, reference sign "001" represents the oxide layer of the isolation region, reference sign "002" represents the tunneling oxide layer, reference sign "003" represents the substrate;

FIG. 3e shows a step of depositing a polysilicon such that the top polysilicon layer of the floating gate and the bottom polysilicon layer of the floating gate are connected with each other, in which:

reference sign "007" represents the top polysilicon layer, reference sign "004" represents the germanium-silicon material, reference sign "001" represents the oxide layer of the isolation region, reference sign "003" represents the substrate, reference sign "002" represents the tunneling oxide layer;

FIG. 3f shows a step of performing a chemical mechanical polishing (CMP) process on the top polysilicon layer and stopping the polishing at the oxide layer of the isolation region, in which:

reference sign "008" represents a ⊥-shape polysilicon floating gate, reference sign "004" represents the germanium-silicon layer, reference sign "001" represents the oxide layer of the isolation region, reference sign "003" represents the substrate, reference sign "002" represents the tunneling oxide layer.

Figure 3G:
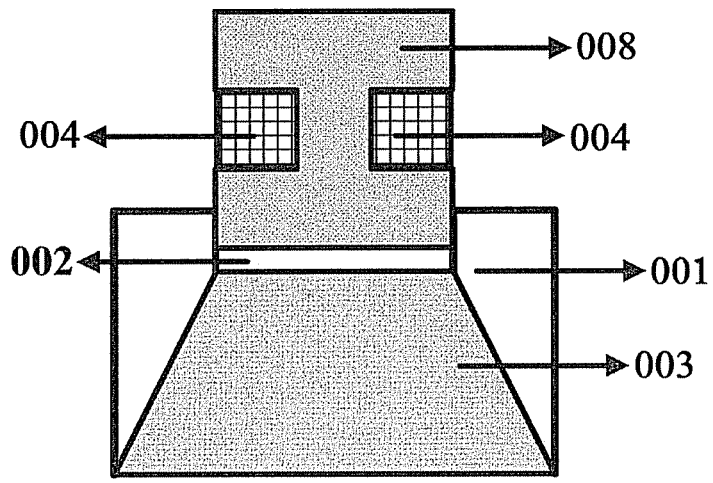
Figure 3H:
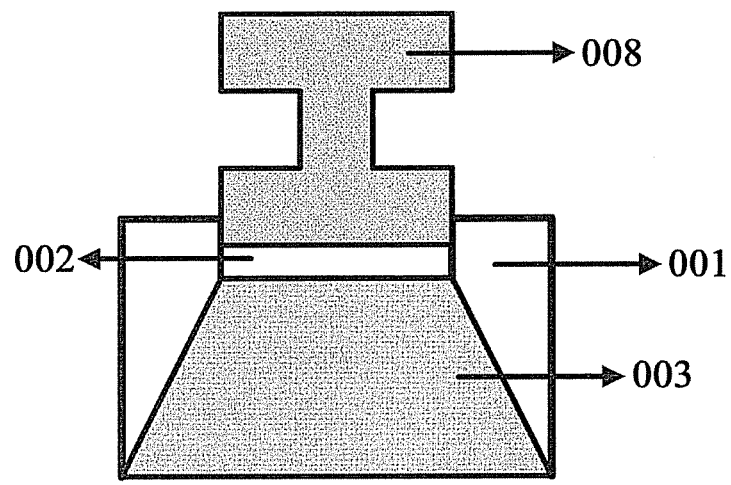
Figure 3I:
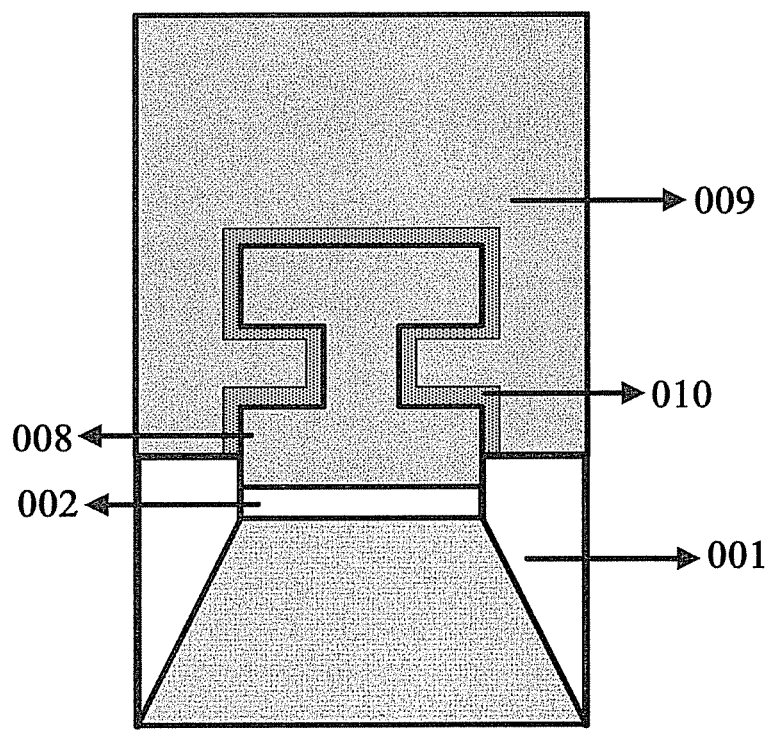

FIG. 3g shows a step of etching back the oxide layer of the shallow trench isolation region and exposing the germanium-silicon layer deposited in the step 4 laterally, in which:

reference sign "008" represents the ⊥-shape polysilicon floating gate, reference sign "004" represents the germanium-silicon layer, reference sign "001" represents the oxide layer of the isolation region, reference sign "003" represents the substrate, reference sign "002" represents the tunneling oxide layer;

FIG. 3h shows a step of removing the germanium-silicon layer via a wet etching process to form the ⊥-shape floating gate structure, in which:

reference sign "008" represents the ⊥-shape polysilicon floating gate, reference sign "001" represents the oxide layer of the isolation region, reference sign "003" represents the substrate, reference sign "002" represents the tunneling oxide layer; and FIG. 3i shows a step of depositing a blocking oxide layer and a polysilicon control gate to form a device having the floating gate, wherein:

reference sign "009" represents the polysilicon control gate, reference sign "010" represents the blocking oxide layer, reference sign "001" represents the oxide layer of the isolation region, reference sign "008" represents the ⊥-shape floating gate, reference sign "002" represents the tunneling oxide layer.

DETAILED DESCRIPTION OF THE EMBODIMENTS

The invention will now be described in detail in conjunction with the drawings. In the detailed description of the embodiments of the invention, for a convenience of illustration, cross-sectional views representing a device structure will be exaggerated partially and not to scale. Moreover, schematic diagrams are examples only, without limiting a protection scope of the invention. Furthermore, practical manufacturing should relate to three-dimensional sizes including length, width and depth.

In one embodiment of the invention, a cross section of a floating gate of a traditional flash memory device along a lateral direction of a channel is modified from a square shape to a エ-shape, which may effectively improve a coupling ratio of the flash memory, thereby lowering an operating voltage and improving a reliability. In the floating gate according to the invention, a height of a middle part of the エ-shape occupies 40%-80% of a height of the entire floating gate, and a width of the middle part occupies 5%-30% of a width of the entire floating gate.

Based on the above, one embodiment of the invention puts forward a novel process method of a floating gate structure, which may be realized by adding several process steps during a manufacturing of a floating gate according to a standard process flow. The process method for suppressing a programming interference of a flash memory provided in the embodiment of the invention is as shown in FIG. 3.

The process method of the novel floating gate structure according to one embodiment of the invention will now be illustrated in detail in conjunction with FIG. 3.

1) First of all, a window (with a width of 65 nm) for a region of the floating gate structure and a tunneling oxide layer (with a thickness of 10 nm) on a surface of an active region are manufactured via the standard process flow of the flash memory, as shown in FIG. 3a.

2) After a gate oxide of the active region is formed in the standard process flow, the floating gate is manufactured according to the process method provided in the embodiment of the invention.

I) A bottom polysilicon layer for a floating gate (with a thickness of 20 nm) and a germanium-silicon material (with a thickness of 160 nm) are deposited sequentially, as shown in FIG. 3b.

II) A top polysilicon layer (with a thickness of 25 nm) is deposited and etched back to form a polysilicon hard mask, as shown in FIG. 3c.

III) The germanium-silicon material is etched by taking the polysilicon hard mask as a hard mask, and the etching is stopped at the bottom polysilicon layer for the floating gate, as shown in FIG. 3d.

IV) A polysilicon layer is deposited such that the top polysilicon layer of the floating gate and the bottom polysilicon of the floating gate are connected with each other, as shown in FIG. 3e.

V) A chemical mechanical polishing (CMP) is performed on the top polysilicon layer, and the polishing is stopped at the oxide layer of the isolation region, as shown in FIG. 3f.

VI) The oxide layer of the shallow trench isolation region is etched back so as to laterally expose the germanium-silicon layer deposited in the step 4, as shown in FIG. 3g.

VII) The germanium-silicon layer is removed via a wet etching process to form the エ -shape floating gate structure, as shown in FIG. 3h.

VIII) A blocking oxide layer (with a thickness of an equivalent oxide layer of 14 nm) and a polysilicon control gate (with a thickness of 200 nm) are deposited to form a device of the floating gate, as shown in FIG. 3i.

3) Thereafter, following standard processes of the flash memory are performed.

The above-described embodiment is not intended to limit the invention. Additional variations and modifications may be made by those skilled in the art without departing from the spirit or scope of the invention. Therefore, a protection scope of the invention is as defined by the appended claims.

What is claimed is:

1. A floating gate structure of a flash memory device, wherein:
    a cross section of the floating gate structure in a direction of a width of a channel is formed in a エ-shape wherein the floating gate structure is divided into three parts comprising an upper part, a middle part and a lower part, and the upper part and the lower part are wider and the middle part is narrower, and the lower part and the upper part are formed to have a uniform width by stacking along an oxide layer in an isolation region, and
    a height of the middle part of the エ-shape occupies 40%-80% of a total height of the floating gate structure, and a width of the middle part of the エ-shape occupies 5%-30% of a total width of the floating gate structure.

2. A method for fabricating a floating gate structure, a cross section of the floating gate structure in a direction of a width of a channel being formed in a エ-shape wherein the floating gate structure is divided into three parts comprising an upper part, a middle part, and a lower part, and the upper part and the lower part are wider and the middle part is narrower, comprising:
    growing a sacrificial silicon oxide layer and depositing a silicon nitride layer on a silicon substrate sequentially;
    performing a photolithography process and an etching process on an active region to form a shallow trench isolation region;
    depositing an oxide layer in the isolation region, removing the sacrificial silicon oxide layer and the silicon nitride layer, so as to open a window for a region of the floating gate structure;
    growing or depositing a tunneling oxide layer, and then depositing a polysilicon floating gate and a germanium-silicon layer sequentially;
    depositing a top polysilicon layer of the floating gate structure and performing an etching back process to form a polysilicon hard mask;
    etching the germanium-silicon layer by taking the polysilicon hard mask as a hard mask, and stopping the etching at the bottom polysilicon layer of the floating gate structure;
    depositing a polysilicon layer such that the top polysilicon layer of the floating gate structure and the bottom polysilicon layer of the floating gate structure are connected with each other;
    performing a chemical mechanical polishing on the top polysilicon layer, and stopping the chemical mechanical polishing at the oxide layer of the isolation region;
    etching back the oxide layer of the shallow trench isolation region to laterally expose the germanium-silicon layer deposited sequentially with the polysilicon floating gate;
    removing the germanium-silicon material via a wet etching process, and depositing a blocking oxide layer; and
    depositing a control gate polysilicon layer, so as to form a
    エshape floating gate structure surrounded by the control gate polysilicon.

3. A flash memory device, wherein:
    a cross section of a floating gate structure of the flash memory device in the direction of a width of a channel is formed in a エ-shape wherein the floating gate structure is divided into three parts comprising an upper part, a middle part and a lower part, and the upper part and the lower part are wider and the middle part is narrower, and the lower part and the upper part are formed to have a uniform width by stacking along an oxide layer in an isolation region, and
    wherein a height of the middle part of the エ-shape occupies 40%-80% of a total height of the floating gate structure, and a width of the middle part of the エ-shape occupies 5%-30% of a total width of the floating gate structure.

* * * * *